United States Patent [19]

Matasick et al.

[11] Patent Number: 5,395,414
[45] Date of Patent: Mar. 7, 1995

[54] DISPLAY PANEL WITH A LARGE REALISTIC DIGITIZED HIGH FIDELITY VISUAL PATTERN AND METHOD FOR PRODUCING THE SAME

[75] Inventors: Donald J. Matasick, Alpharetta; Don Bratton, Norcross, both of Ga.

[73] Assignee: Dover Designs, Inc., Alpharetta, Ga.

[21] Appl. No.: 48,286

[22] Filed: Apr. 14, 1993

[51] Int. Cl.$^6$ .................. C03C 17/00; C03B 27/00; B05D 5/00; B44F 9/00

[52] U.S. Cl. ................ 65/60.1; 65/104; 65/114; 427/280; 427/281; 427/287; 428/15; 428/151; 428/210; 428/904; 101/129; 156/61

[58] Field of Search .......... 65/60.1, 60.5, 60.2, 65/60.8, 114, 104; 427/267, 268, 269, 280, 281, 287; 101/129, 128.4; 156/61; 428/151, 15, 210, 904

[56] References Cited

U.S. PATENT DOCUMENTS

| | | | |
|---|---|---|---|
| 494,063 | 3/1893 | Grosse | 65/60.8 |
| 654,404 | 7/1900 | Laffan | 427/268 |
| 690,889 | 1/1902 | Von BonHorst | 427/268 |
| 993,993 | 5/1911 | Hill | 427/268 |
| 1,623,967 | 4/1927 | Moross | 427/268 |
| 1,773,948 | 8/1930 | Casto | 427/267 |
| 2,215,227 | 9/1940 | Nash | 65/60.8 |
| 2,266,926 | 12/1941 | Vida | 427/268 |
| 3,696,742 | 10/1972 | Parts et al. | 101/128.4 |
| 4,203,360 | 5/1980 | Madwed | 101/129 |
| 4,217,381 | 8/1980 | Asano | 427/340 |
| 4,300,933 | 11/1981 | Thomas | 65/114 |
| 4,300,934 | 11/1981 | DeTorre | 65/114 |
| 4,536,431 | 8/1985 | Wyckoff | 428/162 |
| 4,903,595 | 2/1990 | Ericsson | 101/128.4 |
| 4,946,763 | 8/1990 | Snakenborg | 101/128.4 |
| 5,063,093 | 11/1991 | Mentzer | 428/141 |
| 5,174,204 | 12/1992 | Meier et al. | 101/129 |
| 5,193,457 | 3/1993 | Hahn et al. | 101/129 |
| 5,201,027 | 4/1993 | Casini | 101/128.4 |

OTHER PUBLICATIONS

Hackett et al, "Color Decoration and Printing on Glass Containers", The Glass Industry, vol. 45, No. 5, May 1964, pp. 237-243.

*Primary Examiner*—W. Gary Jones
*Assistant Examiner*—Steven P. Griffin
*Attorney, Agent, or Firm*—Hopkins & Thomas

[57] ABSTRACT

A novel display panel (10) has a high fidelity visual pattern with a full range of grey scale values, for instance, a marble or leather pattern, which is produced via a novel methodology (20). In accordance with the novel methodology (20), a high resolution visual pattern (31) and a mask pattern (32) are produced and separately printed. The patterns (31, 32) are then superimposed and exposed to a camera (33) which generates an enlarged photograph positive. A silk screen is produced from the enlarged photograph positive and used to print a high fidelity visual pattern onto a glass substrate (13). The glass substrate (13) and visual pattern (14) are then heated in a tempering oven to derive the display panel (10).

22 Claims, 3 Drawing Sheets

DISPLAY PANEL WITH A LARGE REALISTIC DIGITIZED HIGH FIDELITY VISUAL PATTERN AND METHOD FOR PRODUCING THE SAME

FIELD OF THE INVENTION

The present invention generally relates to the graphic design industry and, more particularly, to a display panel with a large, realistic, digitized, high fidelity, visual pattern, for example, a marble or leather pattern, and a method for producing the same.

BACKGROUND OF THE INVENTION

It is known in the art to produce a display panel in the form of a planar piece of glass with any geometric perimeter configuration and with a visual pattern printed on or affixed to the underside of the glass piece. The visual pattern may include artwork, text, or other information to be conspicuously displayed. Generally, the display panels can be placed on the tops of tables or other surfaces for protection of the surfaces, for providing easily cleaned surfaces, and for providing an aesthetically pleasing display of the visual pattern.

In order to produce a display panel in the conventional art, the visual pattern is first derived and then photographed to produce a photograph positive at generally the same size as the provided visual pattern. The photograph positive is then used to create a silk screen having numerous meshes, usually about 40 to 45 per inch. The silk screen is essentially a negative of the pattern. Next, using the silk screen, the artwork pattern is printed onto the underside of the glass piece.

The process of silk screening is a stenciling process in which ink or paint are forced through the meshes of the silk screen and onto a surface leaving the silk screen pattern on the surface. There are essentially two known techniques for silk screening artwork patterns onto glass utilizing different types of ink. In a first technique, an image is screened onto the glass, one color at a time, and then the glass is passed through a drying oven after each color is applied. While this method has certain advantages, it does not produce a permanent image, in that the image can be removed by an abrasive action or the image can be faded by ultraviolet (UV) light or the like.

In another silk screening technique, ceramic inks are utilized to print artwork on the glass. After all colors of the image have been silk screened onto the glass and dried, the glass is passed through a tempering oven, where the ceramic inks are fired into the glass and actually become an integral part of the glass. In the foregoing technique, the ceramic inks become a durable coating layer of the glass and are totally resistant to UV degradation, abrasion, peeling, or chemical attack. For these reasons, the foregoing technique is better suited for the fabrication of display panels as described hereinabove.

Although fabrication of display panels having silk-screened visual patterns is well known in the art, creation of some visual patterns on the display panel has been problematic and elusive. For example, creation of high quality marble and leather patterns on large display panels, perhaps greater than 18 inches on a side, has traditionally been unrealized due to the inherent complex features and varying requisite color shades (grey scale). Some years ago, Pittsburgh Paint & Glass (PPG) Industries, Inc. of Pittsburgh, Pa., U.S.A., unsuccessfully attempted to produce and market a display panel having a marble and granite pattern. However, the pattern was of extreme low quality in that it lacked the warmth, depth, and flow patterns normally found in natural marble and granite. The PPG marble pattern exhibited sharp, distinct contrasting line separations between colors, rather than smooth color transitions found in natural stones, and generally looked like a cheap imitation. Consequently, PPG was forced to remove the product from the market.

Thus, a heretofore unaddressed need exists in the industry for a low cost graphic design technique which can be used to produce a large, realistic, digitized, high fidelity, visual pattern, for example, a marble or leather pattern, in a glass display panel.

SUMMARY OF THE INVENTION

Accordingly, an object of the present invention is to overcome the deficiencies and problems associated with the prior art as recited above.

Another object of the present invention is to provide a method for producing a digitized high fidelity visual pattern having complex features on a glass piece, such as in a display panel.

Another object of the present invention is to provide a method for producing very large exacting likenesses of marbles, leathers, and other materials having complex features and a full range of grey scale values on glass using a silk screening process.

Another object of the present invention is to provide a display panel having a digitized high fidelity visual pattern with complex features, such as a visual pattern comprising a realistic marble image or a realistic leather image.

Another object of the present invention is to provide a method for producing a digitized high fidelity visual pattern having complex features and a full range of grey scale values which is very large, perhaps greater than 18 inches on a side thereof.

Another object of the present invention is to provide a method for producing a digitized high fidelity visual pattern on a glass piece which is inexpensive and which can be implemented using graphic design techniques.

Briefly described, the present invention is a display panel having a digitized high fidelity visual pattern with complex features and a novel methodology for producing the display panel. The method involves the following steps: producing a scan of a digitized high resolution visual pattern in software with an ultimate resolution of greater than about 300 to 500 percent of the high fidelity visual pattern; printing the digitized high resolution visual pattern from the software; forming an enlarged photograph positive from the printed digitized high resolution visual pattern, the enlarged photograph positive having the ultimate resolution of the high fidelity visual pattern: producing a silk screen from the enlarged photograph positive; screening the high fidelity visual pattern onto a glass piece from the silk screen of the enlarged photograph positive; and heating the glass piece to temper the digitized high fidelity pattern on the glass piece. A further step may be added whereby a mask pattern is produced which is then printed so that it may be placed adjacent to the high resolution visual pattern for forming an enlarged photograph positive from the combination of both.

An advantage of the present invention is that it is simple to implement and does not require use of high cost photography in order to generate a high fidelity visual pattern on the glass piece.

Another advantage of the present invention is that the display panel can be used for a wide variety of applications, including for example, as indoor and outdoor furniture parts, fireplace surrounds, wall tile, appliance tops and panels, interior and exterior wall cladding, and table tops or coverings.

Other objects, features, and advantages of the present invention will become apparent to one of skill in the art upon examination of the following drawings and detailed description.

BRIEF DESCRIPTION OF THE DRAWINGS

The following drawings are not necessarily to scale, emphasis instead being placed upon clearly illustrating principles of the present invention.

DETAILED DESCRIPTION OF THE PREFERRED EMBODIMENT

Figure 1B:
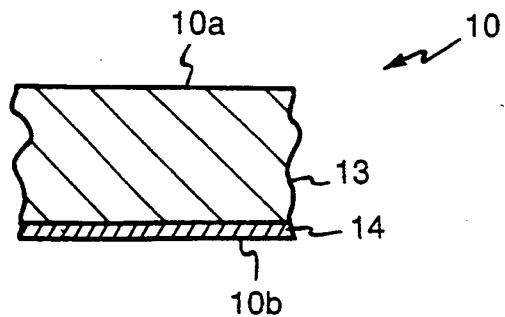
FIG. 1B is a cross-sectional view of the display panel of FIG. 1A taken along line 1'—1'.
Figure 1A:
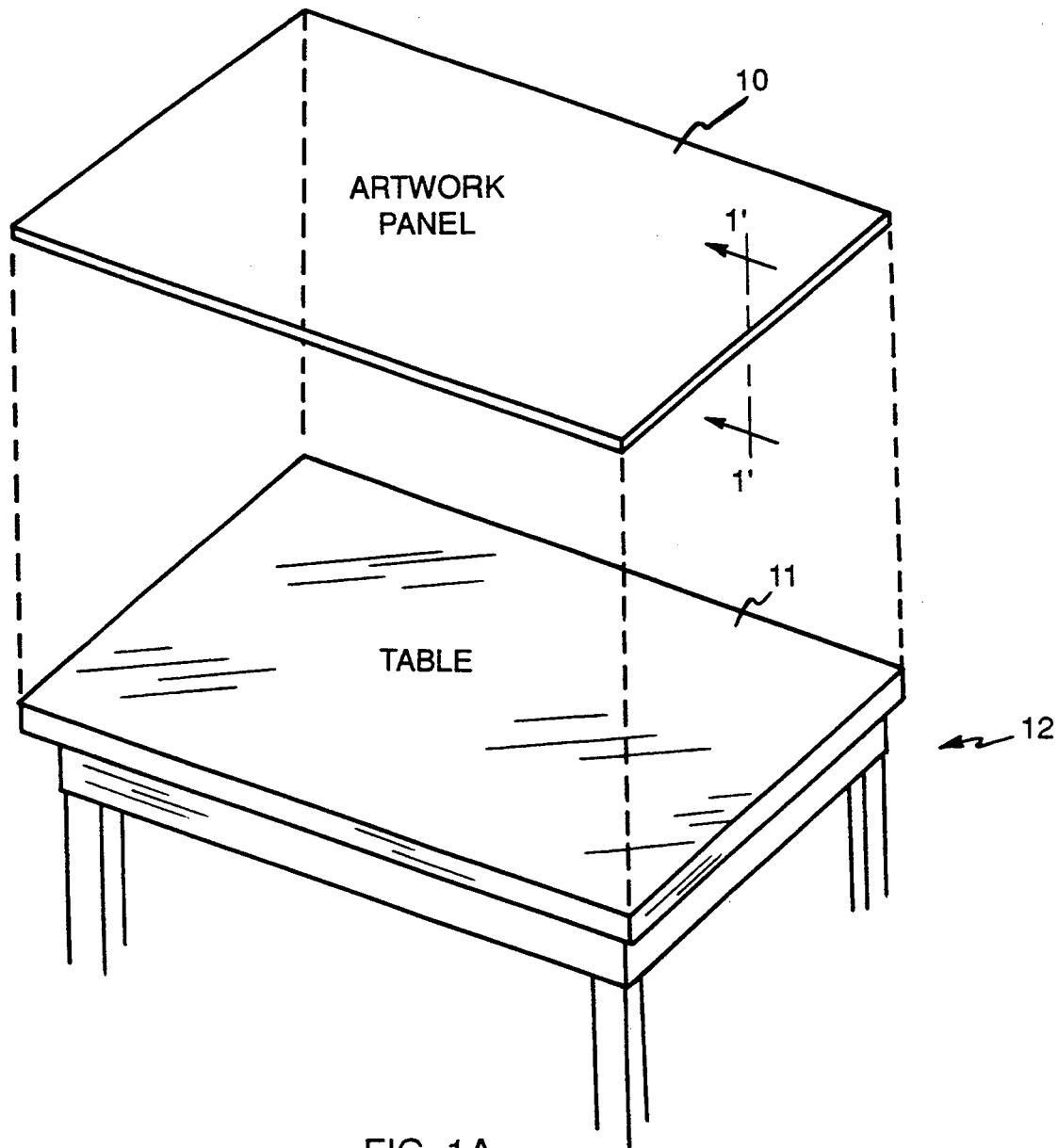
FIG. 1A is a perspective view of a novel display panel produced in accordance with the present invention.
Figure 2:
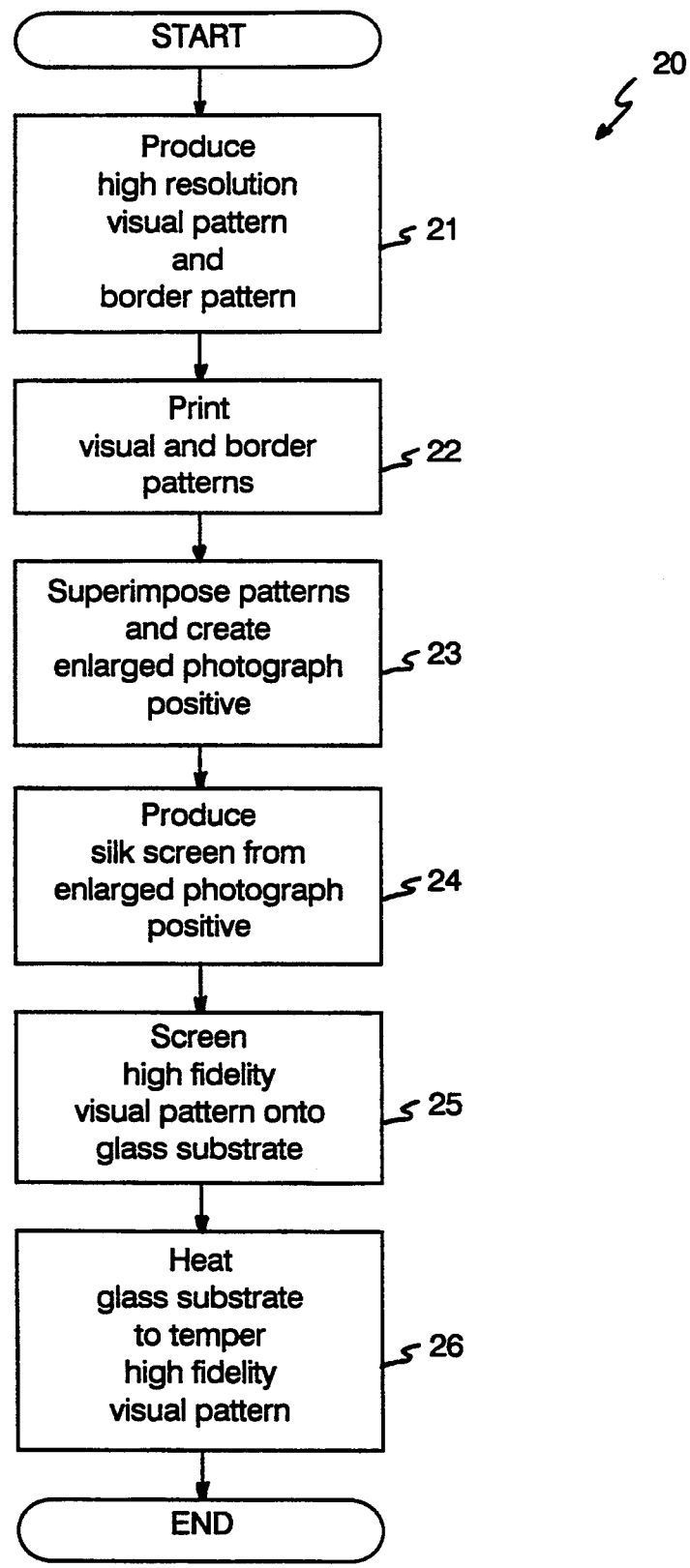
FIG. 2 is a block diagram illustrating the novel methodology of the present invention for producing the display panel of FIGS. 1A and 1B.

With reference now to the drawings wherein like reference numerals designate corresponding parts throughout the several views, FIGS. 1A and 1B illustrate a novel substantially planar display panel 10 produced in accordance with a novel methodology 20 of FIG. 2. As shown in FIG. 1A, the display panel 10 with opposing surfaces 10a, 10b may be placed on the top surface 11 of a table 12, for example. As illustrated in FIG. 1B, the display panel 10 has a glass substrate 13 with a visual pattern 14 bonded or otherwise affixed thereto. As the underside surface 10b of the display panel 10 rests on the table top surface 11, light passes through the upper surface 10a and glass substrate 13, strikes the visual pattern 14, and is reflected back through the glass substrate 13 and outwardly from the upper surface 10a of the display panel 10, thereby propagating a perceptible image of the visual pattern 14. The visual pattern 14 is printed onto the underside of the glass substrate 13 in accordance with printing process which is further described in regard to the novel methodology 20 hereinafter. It should be further noted that the display panel 10 can be produced with a perimeter having virtually any geometric shape and may be utilized in many other applications apart from the table 12. Examples of other application include, for example, indoor and outdoor furniture parts, fireplace surrounds, wall tile, appliance tops and panels, and interior or exterior wall cladding.

Referring to FIG. 2, the novel methodology 20 comprises the steps as set forth in flowchart blocks 21 through 26. Initially, as indicated in the flowchart block 21, a large digitized high resolution visual pattern with complex features, such as a visual pattern of marble or leather, is produced in software with a resolution of greater than about 300 to 500 percent of the visual pattern 14 of the display panel 10. In the preferred embodiment, a visual pattern is produced having a resolution of greater than about 400 picture elements, or pixels. To this end, a software scan, or tiff, of a small high resolution visual pattern is obtained and then the size of the visual pattern is enhanced without adversely affecting the scale of the visual pattern. In the preferred embodiment, a software scan of a visual pattern measuring 3 by 5 inches with a resolution of greater than 400 pixels per inch is obtained and is used to generate the much larger visual pattern with the same resolution. Photographs of artwork, text, or other visual patterns may be scanned into software to create the tiff.

The small visual pattern is preferably enhanced with any conventional software program, for instance, a paint program. A suitable paint program for this purpose is called Adobe PHOTOSHOP, which is manufactured by and commercially available from Adobe Systems, Inc., Mountain View, Calif., U.S.A.

The colors of the small visual scan are separated so that red, green, and blue patterns are generated, or alternatively, so that cyan, magenta, yellow, and black patterns are generated. These patterns are manipulated to obtain higher contrast, but they also must retain enough gray value so that a silk screen process may be utilized hereinafter.

In order to enlarge the visual pattern without adversely affecting the scale of the pattern, a tile is formed from the image and the tile is repeated as needed to create a larger pattern. The tile is created by viewing the bottom part and right side part of the original pattern and by manipulating the top part and left side part, respectively, so as to create a matching relationship. After the tile has been repeated numerous times, the overall pattern may be manipulated so as to hide the repeated tile pattern.

Furthermore, a mask pattern, also called a flood screen, is produced using any conventional drawing program, for instance, using Aldus FREEHAND, which is a drawing program manufactured by and commercially available from Aldus Freehand Inc., Seattle, Wash., U.S.A. The mask pattern is essentially a pattern which lays out the ultimate perimeter of the visual pattern on the display panel 10. In the example shown in FIG. 1A, the mask pattern comprises merely a transparent rectangle, generally corresponding to the approximate size of the table top 11, with radiused corners and an opaque (i.e., black) background area surrounding the rectangle.

As indicated in the flowchart block 22, a high resolution visual pattern 31 and a mask pattern 32 are separately printed by a high resolution laser image setter, which is well known in the art. In the preferred embodiment, the high resolution laser image setter produces patterns 31, 32 measuring within an approximate area of 12 by 18 inches with a resolution of between approximately 300 and 500 pixels per inch, preferably about 400 pixels per inch, using film having 3386 dots per inch (DPI). The film dots are essentially much smaller than the pixels, and the pixels are aggregated in a sense to form the pixels. It should be further noted that most conventional high resolution laser image setters can use only film having 2540 DPI. Examples of suitable laser image setters are a Linotronic image setter manufactured by and commercially available from Linotype Company, U.S.A.

Moreover, conventional high resolution laser image setters can only print up to 150-200 pixels per inch. This limitation has resulted due, in large part, to the printing industry which utilizes presses which are limited to 150–200 pixels per inch. In accordance with the present invention, the image setter must be modified so that it is capable of printing greater than 200 pixels per inch. In order to modify most image setters, such as the Linotronic image setter mentioned previously, internal software filters which limit printing to 150–200 pixels per inch are merely eliminated.

It should be further noted that most screen finders on the conventional image setters, which count pixels per inch on the printed documents, have a limitation of 150–200 pixels per inch. In order to determine and adjust the printer resolution, it may be necessary to manually magnify and count pixels, and adjust the system by trial and error.

Figure 3:
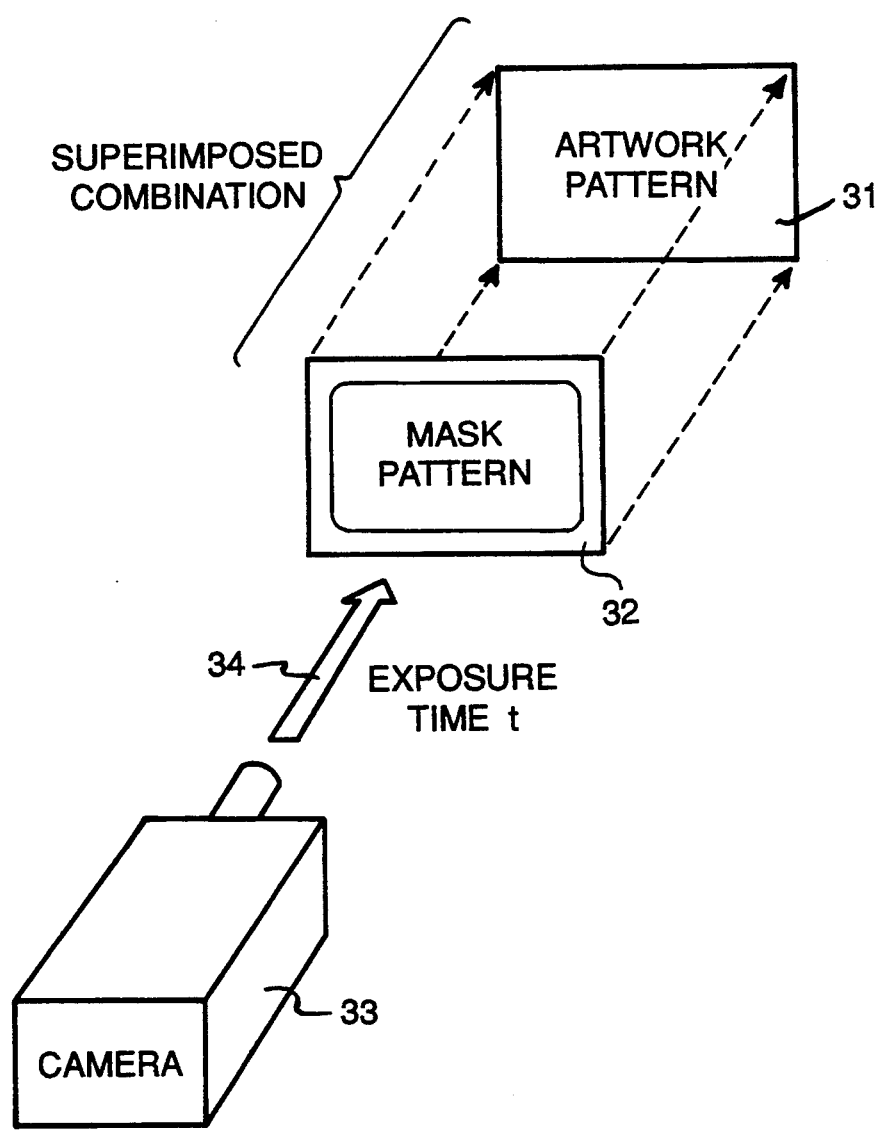
FIG. 3 is a schematic view illustrating superimposition of a mask pattern with a visual pattern to derive an enlarged photograph positive in accordance with the novel methodology of FIG. 2.

Next, as indicated in flowchart block 23 of FIG. 2, the high resolution visual pattern 31 and the mask pattern 32 are sandwiched together to form a superimposed combination which is used to create an enlarged photograph positive, which in the preferred embodiment measures within an approximate area of 53 by 74 inches at a resolution of approximately 65 to 100 pixels per inch. The procedure for creating the enlarged photograph positive is schematically illustrated in a perspective view of FIG. 3. As illustrated in FIG. 3, the mask pattern 32 is placed over the visual pattern 31 and the resultant image is exposed to a conventional camera 33, as indicated by an arrow 34, which has magnifying picture lenses or the like. The camera 33 preferably uses conventional high contrast lithocamera speed film, which is a high end film having a high silver content and high DPI.

In addition, the inventors have determined that the exposure t is important when generating certain visual patterns, for example, marble and leather patterns. The exposure must be adjusted so as to achieve a balance between high contrast and clear film. The shorter the exposure, the more gray value in the resultant photograph positive, and the longer the exposure time t, the higher contrast in the photograph positive generated by the camera 33. A marble pattern with too much contrast appears cheap and artificial.

Referring back to FIG. 2, as indicated in the flowchart block 24, a silk screen is now formed from the enlarged photograph positive generated by the camera 33. The silk screen which is generated is essentially a "negative" as known in the photography and graphic design industries. The formation of the silk screen and the screening process are well known in the art and are not described herein for purposes of simplicity.

The silk screen is used to print a high fidelity visual pattern onto the glass substrate 13. Any suitable silk screen printing materials may be utilized in the silk screening process. Preferably, the silk screen printing material is a ceramic ink capable of being fired into the surface of the glass substrate 13 to thereby become an integral part of the glass substrate 13. Different colors are applied to the glass substrate 13 via separate screening iterations.

Certain parameters of the silk screen and process used in the present invention are worth mentioning. Specifically, the silk screen is produced with about 65 to 100 meshes per inch, or pixels per inch, in order to ultimately produce a high fidelity visual pattern of similar pixel resolution. This resolution is considered very high in the art of silk screening, which generally utilizes screens having about 40–45 pixels per inch. Furthermore, the inventors have determined that increasing the number of meshes to a greater number than specified above results in substantial loss of the grey value of the images being printed. This is extremely problematic for marble, which comprises much grey value, in that it completely fades the marble image. To a lesser extent, it is problematic for leather in that it depletes the grey value while leaving discrete line boundaries, thereby producing a cheap-looking, unrealistic leather pattern.

Once all colors have been screened onto the glass substrate 13 and permitted to dry, the glass substrate 13 is then passed through a glass tempering oven, as indicated in the flowchart block 26 of FIG. 2. The oven heats the glass substrate 13 and visual pattern 14 to approximately 1250° F. so as to temper the ceramic ink on the glass substrate 13. After tempering, the high resolution visual pattern 31 becomes an integral part of the glass substrate 13 and is extremely durable. The visual pattern 31 becomes a totally permanent finish, comprised of ceramic frit and earthen oxide pigments. It resists all types of deterioration due to scratching, peeling, chipping, fading and chemical attack.

Thus, in summary relative to the preferred embodiment, the novel methodology 20 permits creation of very realistic marble and leather patterns for display panels 10 measuring up to 53 by 74 inches with a resolution of approximately 65 to 100 pixels per inch from a very small software scan of a respective pattern with a resolution of greater than 400 pixels per inch. The foregoing is accomplished by pushing the existing limitations on both image setter technology and silk screen technology. It should be also emphasized that the foregoing specific parameters should in no way be construed as restricting the present invention and that many other parameters are possible in light of the teachings herein.

Finally, it will be obvious to those skilled in the art that many other modifications and variations may be made to the preferred embodiment described above without substantially departing from the spirit and scope of the present invention. Accordingly, all such variations and modifications are intended to be included herein and within the scope of the following invention claims.

Therefore, the following is claimed herein:

1. A method for producing a large realistic high fidelity visual pattern having complex features on a glass piece, comprising the steps of:
    (a) producing a digitized high resolution visual pattern in software with a resolution of greater than 300 percent of said high fidelity visual pattern;
    (b) printing said digitized high resolution visual pattern from said software to produce a printed digitized high resolution visual pattern;
    (c) forming an enlarged photograph positive from said printed digitized high resolution visual pattern, said enlarged photograph positive having an ultimate resolution of said high fidelity visual pattern;
    (d) producing a silk screen from said enlarged photograph positive;
    (e) screening said high fidelity visual pattern onto said glass piece from the silk screen of said enlarged photograph positive; and
    (f) heating said glass piece to temper said high fidelity visual pattern screened onto said glass piece.

2. The method of claim 1, further comprising the steps of:
    producing a mask pattern;
    printing said mask pattern;

placing said printed mask pattern adjacent to said printed high resolution visual pattern to form a combination; and forming said enlarged photograph positive from the combination of said printed high resolution visual pattern and said printed mask pattern.

3. The method of claim 2, wherein the step of placing said printed mark pattern adjacent to said printed high resolution visual pattern to form a combination further comprises the steps of:

exposing said printed high resolution visual pattern and said mask pattern to a camera in order to create an image;

enlarging said image; and producing said photograph positive from said image.

4. The method of claim 3, wherein said printed high resolution visual pattern has a resolution of greater than 400 pixels per inch.

5. The method of claim 3, wherein step (f) comprises the step of passing said glass piece through a tempering oven at about 1250 degrees F.

6. The method of claim 3, wherein said high fidelity visual pattern has a resolution of 65 to 100 pixels per inch.

7. The method of claim 1, wherein said high fidelity visual pattern comprises a pattern with an appearance of marble.

8. The method of claim 1, wherein said high fidelity visual pattern comprises a pattern with an appearance of leather.

9. The method of claim 1, wherein step (b) uses a high resolution laser image setter and image setter film having a 3386 DPI resolution.

10. The method of claim 1, wherein said printed high resolution visual pattern has a resolution of greater than 300 percent of said high fidelity visual pattern.

11. A method for producing a large digitized high fidelity visual pattern on a glass piece, comprising the steps of:

(a) producing a scan of a digitized high resolution visual pattern with a resolution of greater than 300 percent of said high fidelity visual pattern;

(b) printing said digitized high resolution visual pattern from said scan to produce a printed digitized high resolution visual pattern;

(c) exposing said printed high resolution visual pattern to a camera in order to create an image;

(d) enlarging said image;

(e) producing a photograph positive from said enlarged image, said photograph positive having an ultimate resolution of said high fidelity visual pattern;

(f) producing a silk screen from said photograph positive;

(g) screening said high fidelity visual pattern onto said glass piece from the silk screen of said photograph positive; and (h) heating said glass piece to temper said high fidelity visual pattern screened onto said glass piece.

12. The method of claim 11, further comprising the steps of:

producing a mask pattern;

printing said mask pattern to produce a printed mask pattern;

placing said printed mask pattern adjacent to said printed high resolution visual pattern; and forming said image by superimposing said printed high resolution visual pattern and said printed mask pattern.

13. The method of claim 11, wherein said high fidelity visual pattern comprises a pattern with an appearance of marble.

14. The method of claim 11, wherein said high fidelity visual pattern comprises a pattern with an appearance of leather.

15. The method of claim 11, wherein step (h) comprises the step of passing said glass piece through a tempering oven at about 1250 degrees F.

16. The method of claim 11, wherein said high fidelity visual pattern has a resolution of approximately 65 to 100 pixels per inch and said printed high resolution visual pattern has a resolution greater than 400 pixels per inch.

17. A method for forming a large digitized high fidelity marble pattern with a resolution of approximately 65 to 100 pixels per inch on a glass piece, comprising the steps of:

producing a digitized high resolution marble pattern in software with a resolution of greater than 400 pixels per inch and producing a mask pattern;

printing said digitized high resolution marble pattern and said mask pattern to produce a printed digitized high resolution marble pattern and a printed mask pattern;

forming an enlarged photograph positive from a superimposed combination of said printed high resolution marble pattern and said printed mask pattern by exposing said superimposed combination to a camera, said enlarged photograph positive having a resolution of 65 to 100 pixels per inch;

producing a silk screen from said enlarged photograph positive;

screening said high fidelity marble pattern onto said glass piece from the silk screen of said enlarged photograph positive; and heating said glass piece to temper said high fidelity marble pattern screened onto said glass piece.

18. The method of claim 17, wherein said heating step comprises passing said glass piece through a tempering oven at 1250 degrees F.

19. The method of claim 17, wherein said printing step is accomplished using a high resolution laser image setter and image setter film having a 3386 DPI resolution to print said digitized high resolution marble pattern.

20. A display panel formed from the method as recited in claim 17.

21. A display panel comprising:

a glass substrate; and a high fidelity visual pattern screened to a surface of said glass substrate, said high fidelity visual pattern having a resolution of approximately 65 to 100 pixels per inch, and said high fidelity visual pattern comprising a realistic appearance of marble.

22. A display panel comprising:

a glass substrate; and a high fidelity visual pattern screened to a surface of said glass substrate, said high fidelity visual pattern having a resolution of approximately 65 to 100 pixels per inch, and said high fidelity visual pattern comprising a realistic appearance of leather.

* * * * *